US009089057B2

(12) United States Patent
Masuda et al.

(10) Patent No.: US 9,089,057 B2
(45) Date of Patent: Jul. 21, 2015

(54) ELECTRONIC DEVICE

(71) Applicant: Panasonic Corporation, Osaka (JP)

(72) Inventors: Kohei Masuda, Osaka (JP); Osamu Shibata, Hyogo (JP); Yoshiyuki Saito, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 76 days.

(21) Appl. No.: 13/891,620

(22) Filed: May 10, 2013

(65) Prior Publication Data

US 2013/0242513 A1    Sep. 19, 2013

Related U.S. Application Data

(63) Continuation of application No. PCT/JP2012/006400, filed on Oct. 4, 2012.

(30) Foreign Application Priority Data

Nov. 11, 2011   (JP) ................................ 2011-247622

(51) Int. Cl.
*H05K 7/02* (2006.01)
*H05K 7/04* (2006.01)
*H05K 1/02* (2006.01)
*H05K 1/14* (2006.01)

(52) U.S. Cl.
CPC .............. *H05K 1/0218* (2013.01); *H05K 1/025* (2013.01); *H05K 1/0277* (2013.01); *H05K 1/14* (2013.01); *H05K 1/147* (2013.01); *H05K 1/0281* (2013.01); *H05K 2201/10189* (2013.01); *H05K 2201/10356* (2013.01); *H05K 2201/10371* (2013.01); *H05K 2201/2009* (2013.01); *H05K 2201/2036* (2013.01)

(58) Field of Classification Search
USPC ............ 174/138 E, 138 G; 361/807, 809, 810
See application file for complete search history.

(56) References Cited

U.S. PATENT DOCUMENTS 4,622,574 A * 11/1986 Garcia .......................... 257/627
4,647,125 A *  3/1987 Landi et al. ..................... 439/67
(Continued)

FOREIGN PATENT DOCUMENTS

JP         06-119821 A     4/1994
JP         H11-040900 A    2/1999
(Continued)

OTHER PUBLICATIONS

International Search Report for corresponding International Application No. PCT/JP2012/006400 mailed Nov. 20, 2012.
(Continued)

*Primary Examiner* — Hung S Bui
(74) *Attorney, Agent, or Firm* — Renner, Otto, Boisselle & Sklar, LLP

(57) ABSTRACT

An electronic device includes a conductor plate, a circuit board placed with a distance to a surface of the conductor plate, a connector provided on the circuit board, a flexible cable having one end connected to the connector and laid down along the surface of the conductor plate, and a cable holding member which includes a sloped holding surface for holding at least part of a portion of the flexible cable ranging from the connector to the surface of the conductor plate and which is electrically connected to the conductor plate.

15 Claims, 14 Drawing Sheets

(56) References Cited

U.S. PATENT DOCUMENTS

| | | | |
|---|---|---|---|
| 5,147,208 A * | 9/1992 | Bachler | 439/67 |
| 6,033,234 A * | 3/2000 | Wang et al. | 439/67 |
| 7,538,672 B2 * | 5/2009 | Lockyer et al. | 340/545.6 |
| 7,551,448 B2 * | 6/2009 | Roberts | 361/737 |
| 7,684,174 B2 | 3/2010 | Yamate | |
| 8,659,906 B2 * | 2/2014 | McClure et al. | 361/749 |
| 8,736,080 B2 * | 5/2014 | Arnold et al. | 257/784 |
| 2004/0198078 A1 | 10/2004 | Otaki | |

FOREIGN PATENT DOCUMENTS

| | | |
|---|---|---|
| JP | 2000-077802 A | 3/2000 |
| JP | 2003-330378 A | 11/2003 |
| JP | 2004-319968 A | 11/2004 |
| JP | 2009-162869 A | 7/2009 |
| JP | 2009-181792 A | 8/2009 |
| JP | 2010-0122550 A | 6/2010 |

OTHER PUBLICATIONS

Form PCT/ISA/237 for corresponding International Application No. PCT/JP2012/006400 dated Nov. 20, 2012.

Japanese Office Action for corresponding Japanese Application No. 2013-518030 mailed Feb. 12, 2014.

International Preliminary Report of Patentability for corresponding International Application No. PCT/JP2012/006400 mailed May 22, 2014 (English Translation).

* cited by examiner

ELECTRONIC DEVICE

CROSS-REFERENCE TO RELATED APPLICATIONS

This is a continuation application of International Application No. PCT/JP2012/006400, with an international filing date of Oct. 4, 2012, which claims priority of Japanese Patent Application NO.: 2011-247622 filed on Nov. 11, 2011, the content of which is incorporated herein by reference.

BACKGROUND OF THE INVENTION

1. Technical Field

The present disclosure relates to an electronic device having a flexible cable and contrived so that electromagnetic noise derived from the flexible cables is reduced.

2. Description of Related Art

In recent years, digital interfaces serving for interconnecting one electronic device to another, or provided within electronic devices have been advanced toward increasingly higher speeds. For example, high-speed serial interfaces using differential signals, such as LVDS (Low Voltage Differential Signaling), HDMI (High-Definition Multimedia Interface) and USB (Universal Serial Bus), are used in AV (Audio-Video) or other electronic devices. As digital signals transmitted in digital interfaces (communication cables) become higher and higher in speed, electromagnetic noise radiated from the communication cables increases more and more. Therefore, in view of suppression of the electromagnetic noise from electronic devices, it is quite important to suppress radiation of electromagnetic noise from communication cables serving for interconnecting one electronic device to another, or from communication cables provided within electronic devices.

In many electronic devices, flexible cables such as flexible flat cables are used as communication cables for interconnecting one component to another, e.g. one circuit board to another, within electronic devices. A flexible flat cable as an example has a structure that a plurality of signal lines formed of plate-like conductors placed in parallel with a specified distance therebetween are sandwiched by two resin films.

In order to suppress radiation of electromagnetic noise from communication cables in high-speed digital interfaces, there is a need for satisfying matchings between respective characteristic impedances of on-circuit-board lines, connectors, communication cables or other transmission path elements and element-to-element characteristic impedances among the transmission path elements. For example, it is important to satisfy a matching between characteristic impedances of flexible flat cables used as communication cables.

The characteristic impedance of a flexible flat cable depends on thickness and width of a conductor constituting signal lines, distances between the signal lines, e.g. chassis or other conductors located in vicinities of the cable. Therefore, in a case where, for example, a flexible flat cable is partly floated in the air while its rest is fixed to the chassis, the characteristic impedance of the flexible flat cable breaks down, and it becomes hard to take a matching with a characteristic impedance of a connection-destined transmission path element.

As a method for suppressing noise radiation from a flexible flat cable, a method of providing a metal shield layer on both surfaces of the flexible flat cable over its entire length is disclosed in Japanese Patent Application No. 2009-181792 A. Providing the metal shield layer makes it possible to obtain a stabilization of the characteristic impedance and a shielding effect for electromagnetic noise.

Japanese Patent Application No. 2010-122550 A discloses a structure that a flexible flat cable connected to a circuit board and extending between a chassis and another circuit board is fixed to the chassis via a bonding member of a specified thickness. Keeping distances from the chassis and the another circuit board at specified values reduces effects of electromagnetic noise from the chassis and the another circuit board to the flexible flat cable.

SUMMARY

However, providing a metal shield layer in a flexible flat cable causes an increase in manufacturing cost of the flexible flat cable.

Also, in the flexible flat cable described in Japanese Patent Application No. 2010-122550 A, its portion fixed to the chassis shows a stability of its characteristic impedance, but it is impossible to take a matching with the characteristic impedance of the portion ranging from the circuit-board connector to the chassis. As a result, increases in electromagnetic noise radiated from the flexible flat cable may occur.

Accordingly, an object of the present disclosure is to provide an electronic device capable of suppressing radiation of electromagnetic noise from flexible cables.

According to this disclosure, there is provided an electronic device comprising: a conductor plate; a circuit board placed with a distance to a surface of the conductor plate; a connector provided on the circuit board; a flexible cable having one end connected to the connector and laid down along the surface of the conductor plate; and a cable holding member which includes a sloped holding surface for holding at least part of a portion of the flexible cable ranging from the connector to the surface of the conductor plate and which is electrically connected to the conductor plate.

According to the electronic device of this disclosure, since the characteristic impedance of the flexible cable within the electronic device is successfully matched, radiation of electromagnetic noise from the flexible flat cable can be suppressed.

DETAILED DESCRIPTION

Hereinbelow, embodiments will be described in detail with reference to the accompanying drawings as required. However, more than necessary detailed description may be omitted from time to time. For example, detailed description of already well-known matters and repetitive description of substantially identical components may be omitted. This is intended to avoid unnecessary redundancies of the following description so as to allow those skilled in the art to make an easier understanding thereof.

The present inventor(s) provides the accompanying drawings and the following description to allow those skilled in the art to make a sufficient understanding of this disclosure, which is not intended to limit subject matters described in the appended Claims. It is also noted that components and members fulfilling similar functions are designated by identical reference signs even among different embodiments.

Embodiment 1

Figure 1:
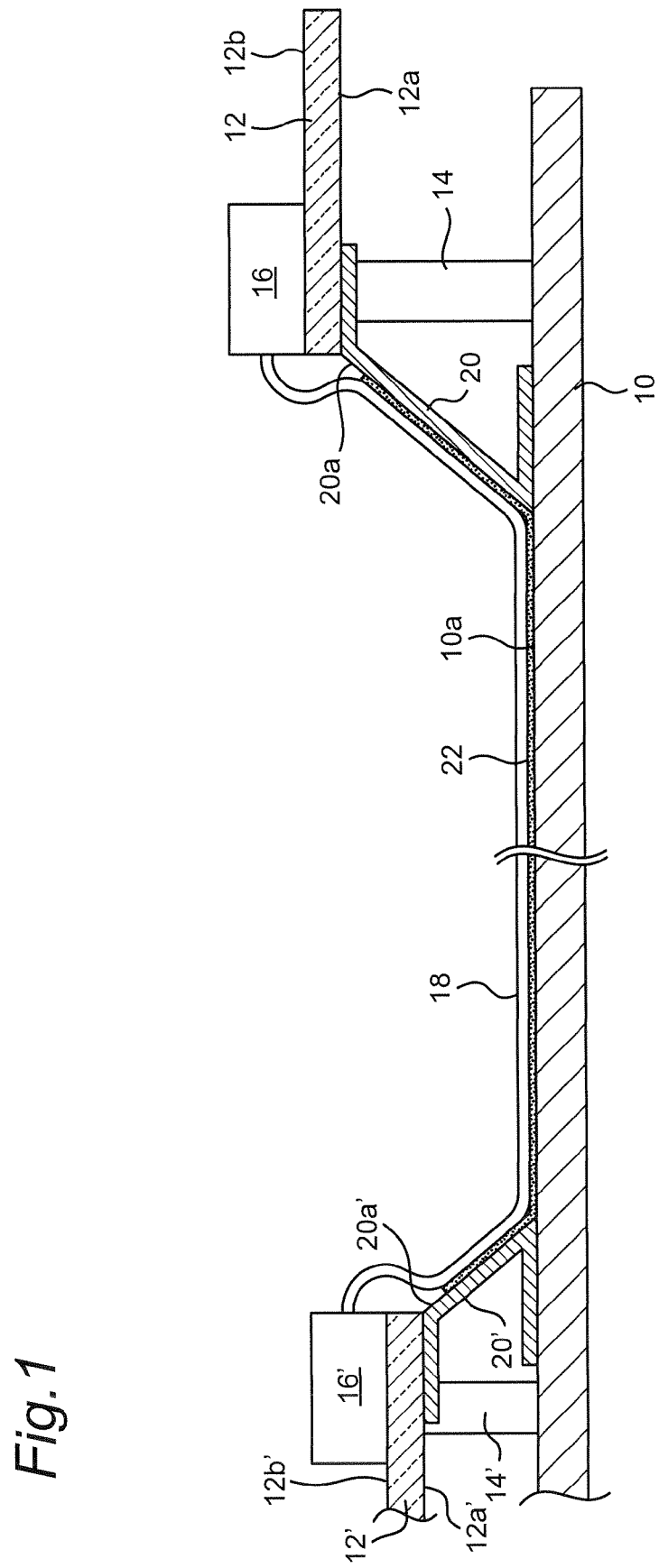
FIG. 1 is a schematic partial sectional view of an electronic device according to Embodiment 1.

FIG. 1 is a sectional view schematically showing an electronic device according to Embodiment 1. The electronic device of this Embodiment 1 is a television, as an example, which internally has a conductor plate (chassis) 10 made from an electroconductive material (e.g., metal), and a plurality of circuit boards 12, 12'. The circuit boards 12, 12' are placed so as to be spaced from a surface 10a of the chassis 10 via spacers 14, 14' and moreover fixed to the chassis 10. In addition, the chassis 10 is grounded.

The circuit boards 12, 12' have connectors 16, 16' for interchanging signals to each other. More specifically, the connectors 16, 16' are provided at edges of surfaces 12b, 12b' of the circuit boards 12, 12' on one side thereof counter to their surfaces 12a, 12a' facing the surface 10a of the chassis 10, respectively.

For interchanging of signals between the circuit boards 12, 12', one end of a flexible flat cable 18 is connected to the connector 16 of the circuit board 12 while the other end is connected to the connector 16' of the circuit board 12'. Also, the flexible flat cable 18 is laid down along the surface 10a of the chassis 10.

The 'flexible flat cable' herein referred to has a structure that a plurality of signal lines made from plate-shaped conductors placed in parallel with a specified distance therebetween are sandwiched by two resin films having dielectric property.

A cable holding member 20 is provided between the circuit board 12 and the chassis 10, while a similar cable holding member 20' is also provided between the circuit board 12' and the chassis 10. The cable holding members 20, 20' fulfill a same function and therefore the cable holding member 20 only will be described below.

Figure 2:
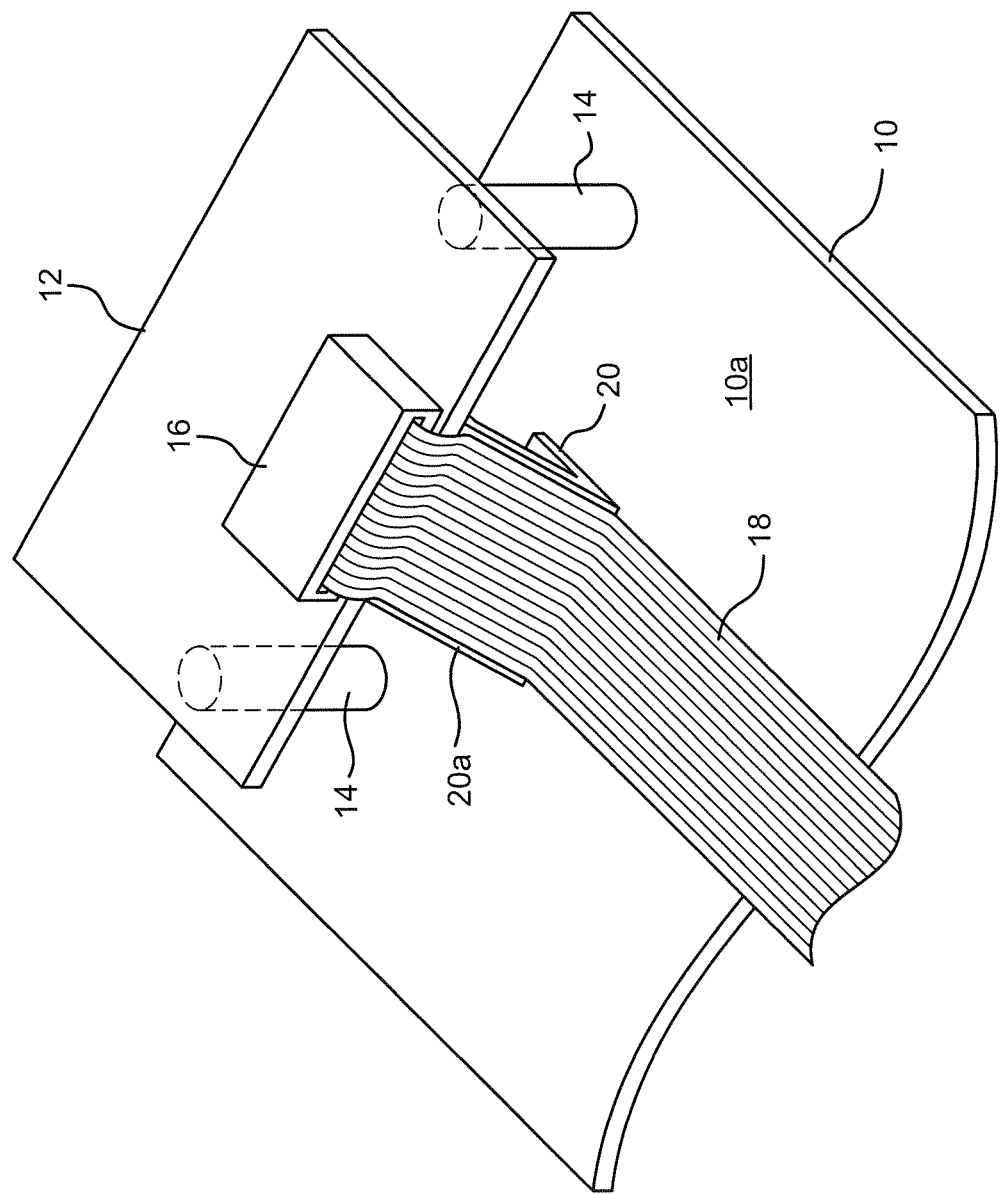
FIG. 2 is a schematic perspective view showing a portion of a flexible flat cable placed between a circuit board and a chassis in the electronic device according to Embodiment 1.

FIG. 2 is a schematic perspective view showing a portion of the flexible flat cable 18 placed between the circuit board 12 and the chassis 10. As shown in FIG. 2, the cable holding member 20 has a sloped holding surface 20a for holding a portion of the flexible flat cable 18 ranging from the connector 16 to the surface 10a of the chassis 10 (more strictly, at least part of the portion of this range).

The cable holding member 20 is made from a material having electrical conductivity, e.g., an electroconductive sheet, metal thin plate or the like. Also, as shown in FIG. 1, the cable holding member 20 has one end fixed to the surface 10a of the chassis 10 and the other end fixed to a surface 12a of the circuit board 12. By means of, for example, an electroconductive adhesive in which electroconductive particles of silver or the like are contained in an insulative material such as epoxy resin, or a double-sided tape (electroconductive double-sided tape) in which an electroconductive adhesion layer is provided on both sides of an aluminum, copper or other electroconductive sheet, the cable holding member 20 is fixed and electrically connected to the surface 10a of the chassis 10. That is, the cable holding member 20 is grounded via the chassis 10. The cable holding member 20 is also fixed to the circuit board 12 by, for example, double-sided tape.

The cable holding surface 20a of the cable holding member 20 extends from an edge of the circuit board 12 toward the surface 10a of the chassis 10. As shown in FIG. 1, the flexible flat cable 18 is fixed in a close contact state to the surface 10a of the chassis 10 and the holding surfaces 20a, 20a' of the cable holding members 20, 20' by an adhesive member 22, e.g., double-sided tape.

In other words, by the intervention of the adhesive member 22 against the surface 10a of the chassis 10 and the holding surfaces 20a, 20a' of the cable holding members 20, 20', the flexible flat cable 18 extends so as to be in parallel with, and spaced by a spacing distance equal to the thickness of the adhesive member 22 from, the surface 10a of the chassis 10 and the holding surfaces 20a, 20a' of the cable holding members 20, 20'.

According to Embodiment 1 of such a constitution shown above, most of the flexible flat cable 18 is held by the chassis 10 and the cable holding members 20, 20'. As a result, the characteristic impedance of the flexible flat cable 18 is matched more than cases in which the cable holding members 20, 20' are absent.

Also with the constitution shown above, the characteristic impedance of the flexible flat cable 18 is reduced.

Figure 3:
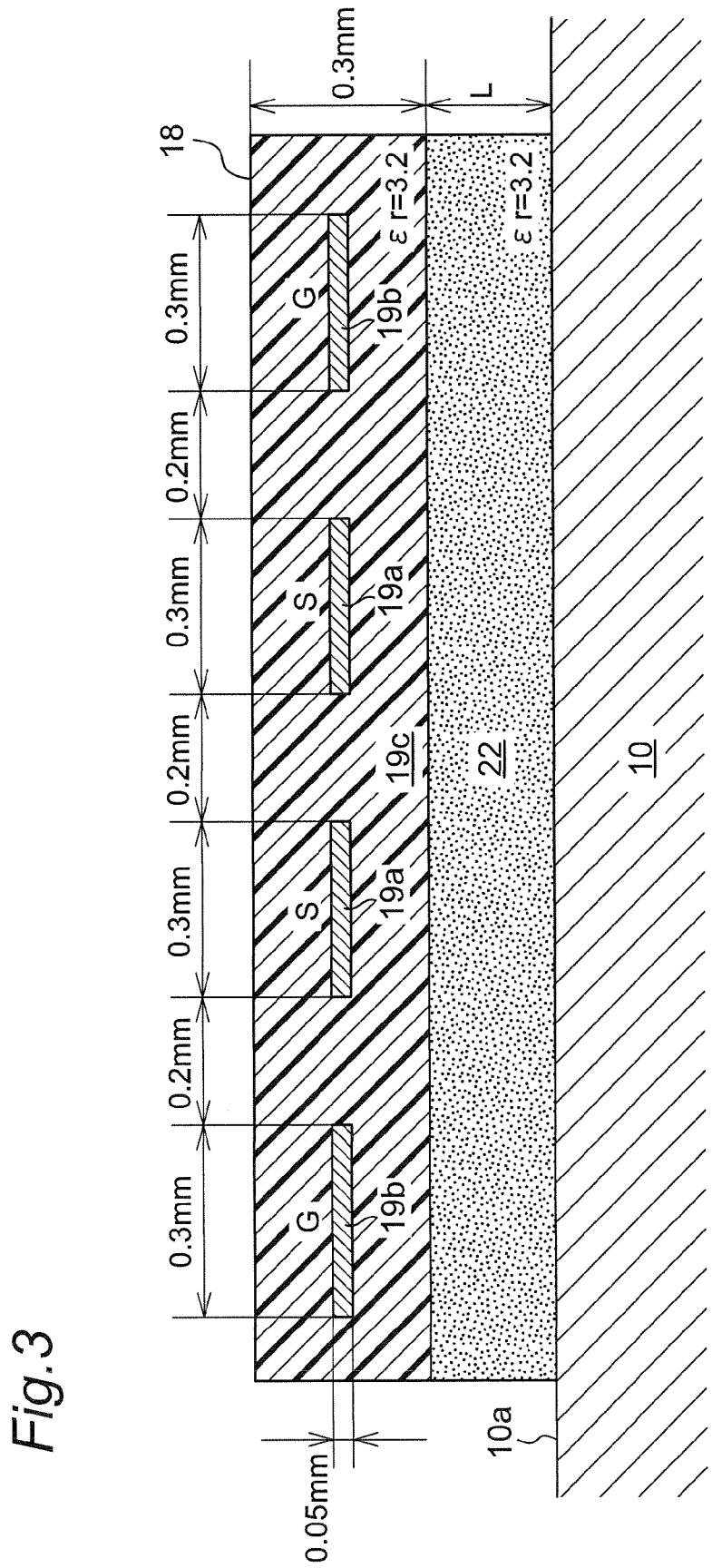
FIG. 3 is a sectional view of a flexible flat cable as an example in a state of being fixed to the chassis via a bonding member.

A concrete example is shown and explained below. For example, FIG. 3 shows the flexible flat cable 18 as an example in a microstrip structure which is fixed to the surface 10a of the chassis 10 via the adhesive member 22 and which includes a plurality of lead wires 19a, 19b. This flexible flat cable 18 has a thickness of 0.3 mm. Also, the plurality of lead wires 19a, 19b included in the flexible flat cable 18 each have a width of 0.3 mm, a thickness of 0.05 mm, and an electrical conductivity of $6.0 \times 10^7$ S/m, and extend in parallel with a distance of 0.2 mm therebetween. Further, two lead wires 19a located closer to a widthwise center of the flat cable are signal lines, and lead wires 19b located on widthwise both sides of the flat cable are ground lines. A dielectric constant ∈r of the resin film 19c and the adhesive member 22 is 3.2.

With the adhesive member 22 having a thickness (distance L between the flexible flat cable 18 and the chassis 10) of 0.001 mm, as shown in Table 1, a differential-mode characteristic impedance of the flexible flat cable 18 is 97Ω. Meanwhile, its common-mode characteristic impedance is 33Ω. With the adhesive member 22 having a thickness (distance L between the flexible flat cable 18 and the chassis 10) of 0.6 mm, as shown in Table 1, a differential-mode characteristic impedance of the flexible flat cable 18 is 120Ω. Meanwhile, its common-mode characteristic impedance is 63.5Ω.

TABLE 1

|  | FFC-chassis distance (mm) | |
| --- | --- | --- |
|  | 0.001 | 0.6 |
| Differential-mode characteristic impedance (Ω) | 97 | 120 |
| Common-mode characteristic impedance (Ω) | 33 | 63.5 |

As shown above, with the adhesive member 22 having a thickness (distance L between flexible flat cable 18 and chassis 10) of 0.001-0.6 mm, the flexible flat cable 18 is enabled to obtain a characteristic impedance value lower than an upper-limit value, 120Ω, of preferred characteristic impedance values.

By attaining matching and reduction of the characteristic impedance of the flexible flat cable 18 with the constitution of Embodiment 1, radiation of electromagnetic noise from the flexible flat cable 18 is suppressed.

Experiment results of reduction of electromagnetic noise from the flexible flat cable 18 by the cable holding members 20, 20' are shown below. Table 2 shows results of measuring radiant intensity of electromagnetic noise in one case where the portion of the flexible flat cable 18 ranging from the connectors 16, 16' of the circuit boards 12, 12' to the chassis 10 is held by the cable holding members 20, 20' (Example 1), and in another case where the portion is not held by the cable holding members 20, 20' but left in floating in the air (Comparative Example 1). These measurement results were obtained during transmission of signals of 220 MHz to the flexible flat cable 18.

TABLE 2

|  | Horizontally polarized wave (dBμV/m) | Vertically polarized wave (dBμV/m) |
| --- | --- | --- |
| Example 1 | 35 | 40 |
| Comparative Example 1 | 40 | 43 |

As shown in Table 2, radiant intensity of electromagnetic noise from the flexible flat cable 18 was lower by 5 (dBμV/m) for horizontally polarized waves and by 3 (dBμV/m) for vertically polarized waves in Example 1, i.e. when the flexible flat cable 18 was held by the cable holding members 20, 20', as compared with Comparative Example 1. From these measurement results, it can be understood that holding the portion of the flexible flat cable 18 ranging from the connectors 16, 16' to the surface 10a of the chassis 10 by the cable holding members 20, 20' allows a reduction of electromagnetic noise from the flexible flat cable 18 to be achieved.

In addition, for reduction of the radiation of electromagnetic noise from the flexible flat cable 18, for example, the chassis 10 and the cable holding members 20, 20' are made from a material of high electrical conductivity such as copper and aluminum.

As shown in FIG. 1, the flexible flat cable 18 is bonded to the chassis 10 and the cable holding members 20, 20' by one adhesive member 22. However, this is not limitative. For example, it is also allowable that the chassis 10 and the flexible flat cable 18 are bonded to each other by a first adhesive member while the cable holding members 20, 20' and the flexible flat cable 18 are bonded to each other by a second adhesive member. In this case, the second adhesive member can be provided in advance on the cable holding members 20, 20' that are not yet fixed to the chassis 10. As a result, workability as to the bonding of the flexible flat cable 18 is improved, as compared with cases in which one adhesive member is provided on the chassis 10 and the cable holding members 20, 20' after the cable holding members 20, 20' are fixed to the chassis 10.

Further, on condition that thicknesses and materials of the first and second bonding members, respectively, are set to proper ones, it becomes possible to fulfill a matching between a characteristic impedance of a portion of the flexible flat cable 18 held by the chassis 10 and a characteristic impedance of another portion held by the cable holding members 20, 20'. In addition, a distance between the first and second bonding members is preferably set to 1/10 or less of a wavelength of the signal having the highest fundamental frequency transmitted within the flexible flat cable 18.

In this connection, for example, a portion of the flexible flat cable 18 ranging from the connector 16, 16' to the cable holding member 20, 20', i.e. a length of the portion in floating in the air, as shown in FIGS. 1 and 2 is also set to 1/10 or less of a wavelength of the signal having the highest fundamental frequency transmitted within the flexible flat cable 18.

Furthermore, the adhesive member 22 may be either insulative or electroconductive.

The insulative adhesive member 22 is made from insulative materials such as silicon-related ones, polyethylene, polypropylene, polyester, acrylic ones, vinyl-related ones, and polyimide. With the adhesive member 22 having insulative property, properly setting its thickness, i.e., properly setting the distance between the signal lines within the flexible flat cable 18 and the chassis 10 makes it possible to set the characteristic impedance of the flexible flat cable 18 to a desired one.

Meanwhile, the electroconductive adhesive member 22 is, for example, an electroconductive adhesive in which electroconductive particles of silver or the like are contained in an insulative material such as epoxy resin, or a double-sided tape (electroconductive double-sided tape) in which an electroconductive adhesion layer is provided on both sides of an aluminum, copper or other electroconductive sheet. With the adhesive member 22 having electroconductivity, the characteristic impedance of the flexible flat cable 18 is determined uniquely on the basis of the distance between the adhesive member 22 and the signal lines (conductors) within the flexible flat cable 18. Thus, the characteristic impedance of the flexible flat cable 18 can be determined without variations.

In addition, as shown in FIG. 1, the flexible flat cable 18 is fixed to the surface 10a of the chassis 10 and the holding surfaces 20a, 20a' of the cable holding members 20, 20' by intervention of the adhesive member 22 against these members. Instead, the flexible flat cable 18 may also be in direct contact with the surface 10a of the chassis 10 and the holding surfaces 20a, 20a' of the cable holding members 20, 20'. Then, adhesive tape may be bonded to the surface 10a of the chassis 10 and the holding surfaces 20a, 20a' of the cable holding members 20, 20' so as to cover the flexible flat cable 18 therewith. In this case, the distance between the flexible flat cable 18 and the chassis 10 becomes substantially zero, so that the characteristic impedance of the flexible flat cable 18 is reduced, as compared with cases in which the adhesive member 22 is interveniently provided between the flexible flat cable 18 and the chassis 10.

Embodiment 2

Embodiment 2 differs from Embodiment 1 in that the portion of the flexible flat cable 18 ranging from the connector 16 to the surface 10a of the chassis 10 is held by part of the chassis 10. Therefore, this Embodiment 2 will be described below mainly about those difference points from Embodiment 1.

Figure 4:
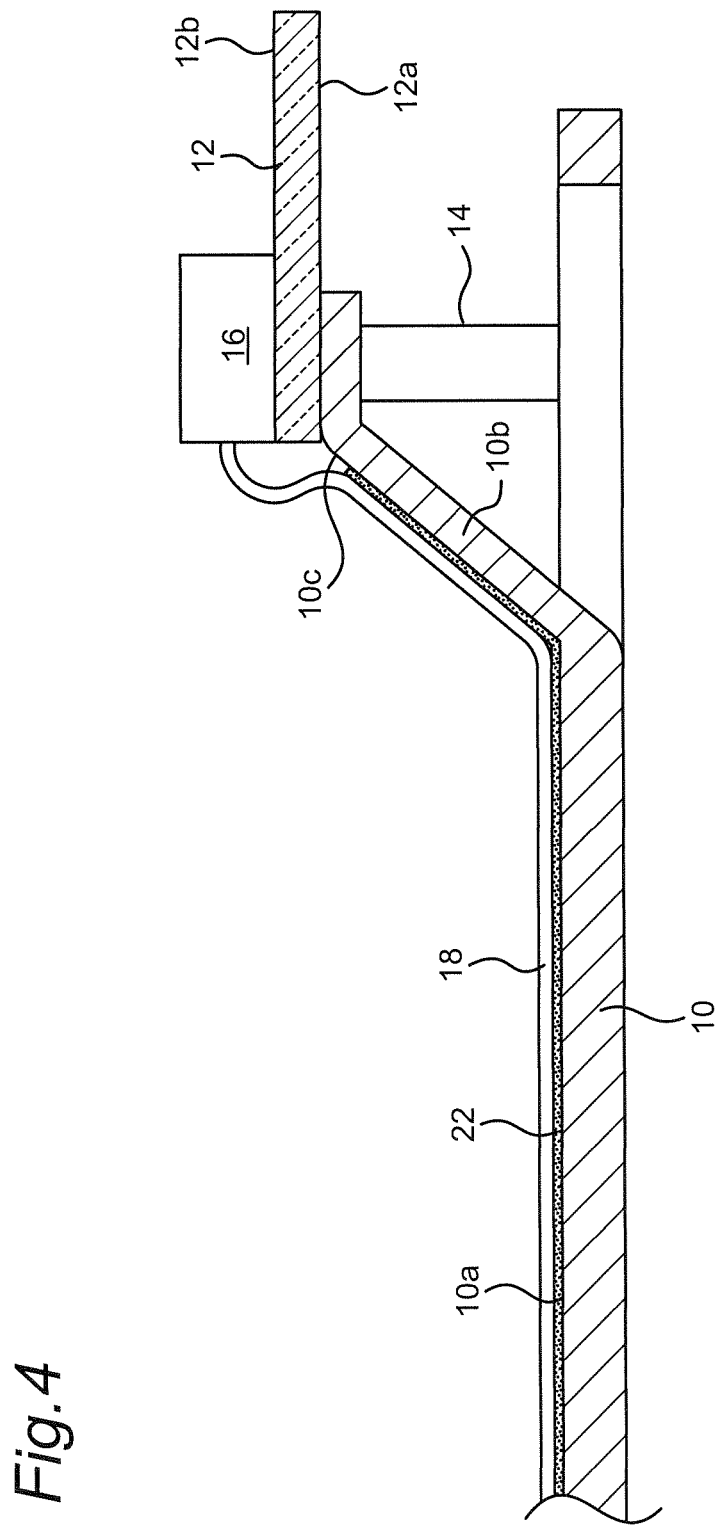
FIG. 4 is a schematic partial sectional view of an electronic device according to Embodiment 2.
Figure 5:
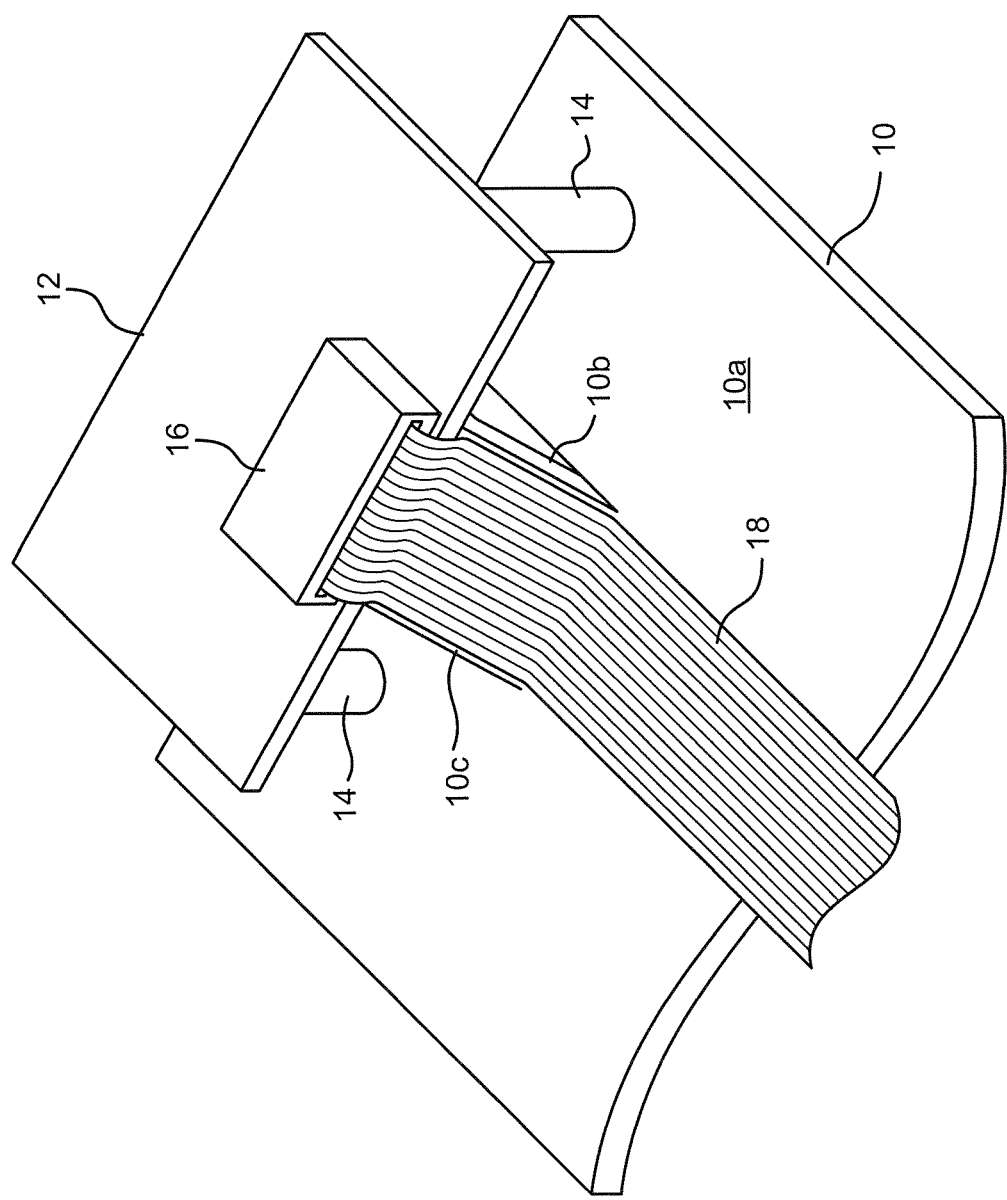
FIG. 5 is a schematic perspective view showing a portion of a flexible flat cable placed between a circuit board and a chassis in the electronic device according to Embodiment 2.

FIG. 4 is a sectional view schematically showing an electronic device according to Embodiment 2. FIG. 5 is a schematic perspective view showing a portion of a flexible flat cable 18 placed between a circuit board 12 and a chassis 10.

As shown in FIGS. 4 and 5, a cable holding part 10b for holding a portion of the flexible flat cable 18 ranging from the connector 16 to the surface 10a of the chassis 10 is formed in the chassis 10. The cable holding part 10b includes a sloped holding surface 10c for holding the flexible flat cable 18 via the adhesive member 22.

The cable holding part 10b is formed by, for example, forming a bracket (square bracket)-shaped cut-in in the chassis 10 and then raising up the portion surrounded by the cut-in. Such a cable holding part 10b is formed, for example, when the chassis 10 is formed from a metal plate by mold pressing.

According to Embodiment 2 of the constitution as shown above, most part of the flexible flat cable 18 extending from the connector 16 is held by the surface 10a and the cable holding part 10b of the chassis 10. As a result, the characteristic impedance of the flexible flat cable 18 is matched more than cases in which the cable holding part 10b is absent. Thus, radiation of electromagnetic noise from the flexible flat cable 18 is suppressed.

Also, since the cable holding part 10b is part of the chassis 10, electrical connectability between the chassis 10 and the cable holding part 10b is higher than one in Embodiment 1, i.e., than one in cases in which the chassis 10 and the cable holding part 20 are provided independent of each other as shown in FIG. 1. As a result, the characteristic impedance of the flexible flat cable 18 is matched to more extent. Further, it becomes unnecessary to fabricate a member (e.g., cable holding members 20, 20' in Embodiment 1) for holding the portion of the flexible flat cable 18 ranging from the connector 16 to the surface 10a of the chassis 10. Thus, the manufacturing cost for the electronic device is reduced.

In addition, the cable holding part 10b of the chassis 10 may be fabricated by another method. For example, in the process of pressing the chassis 10, a swollen portion including a holding surface for holding the flexible flat cable may be formed as the cable holding part 10b in the chassis 10. Further, the circuit board 12 may also be fixed to an upper end of the cable holding part 10b. That is, the cable holding part 10b may serve also as a fitting portion for the circuit board 12. In this case, the spacer 14 is no longer necessitated.

Embodiment 3

Embodiment 3 differs from Embodiment 1 in the method of electrical connection between the cable holding member and the chassis. Therefore, this Embodiment 3 will be described mainly about this difference point from Embodiment 1.

Figure 6:
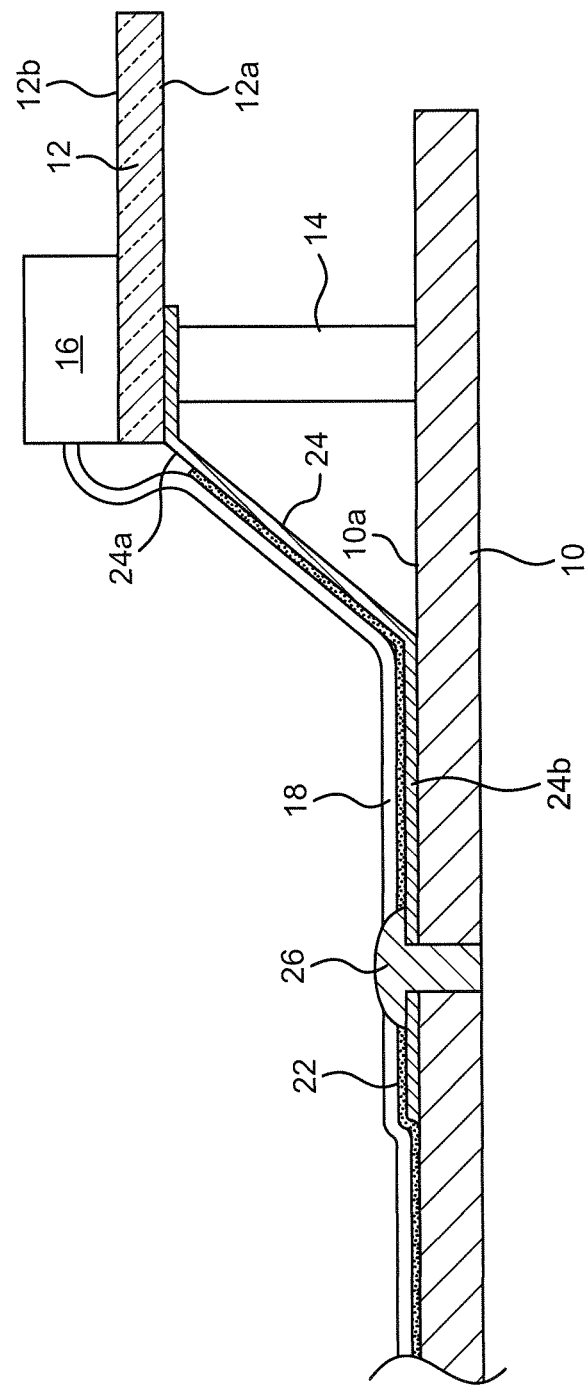
FIG. 6 is a schematic partial sectional view of an electronic device according to Embodiment 3.
Figure 7:
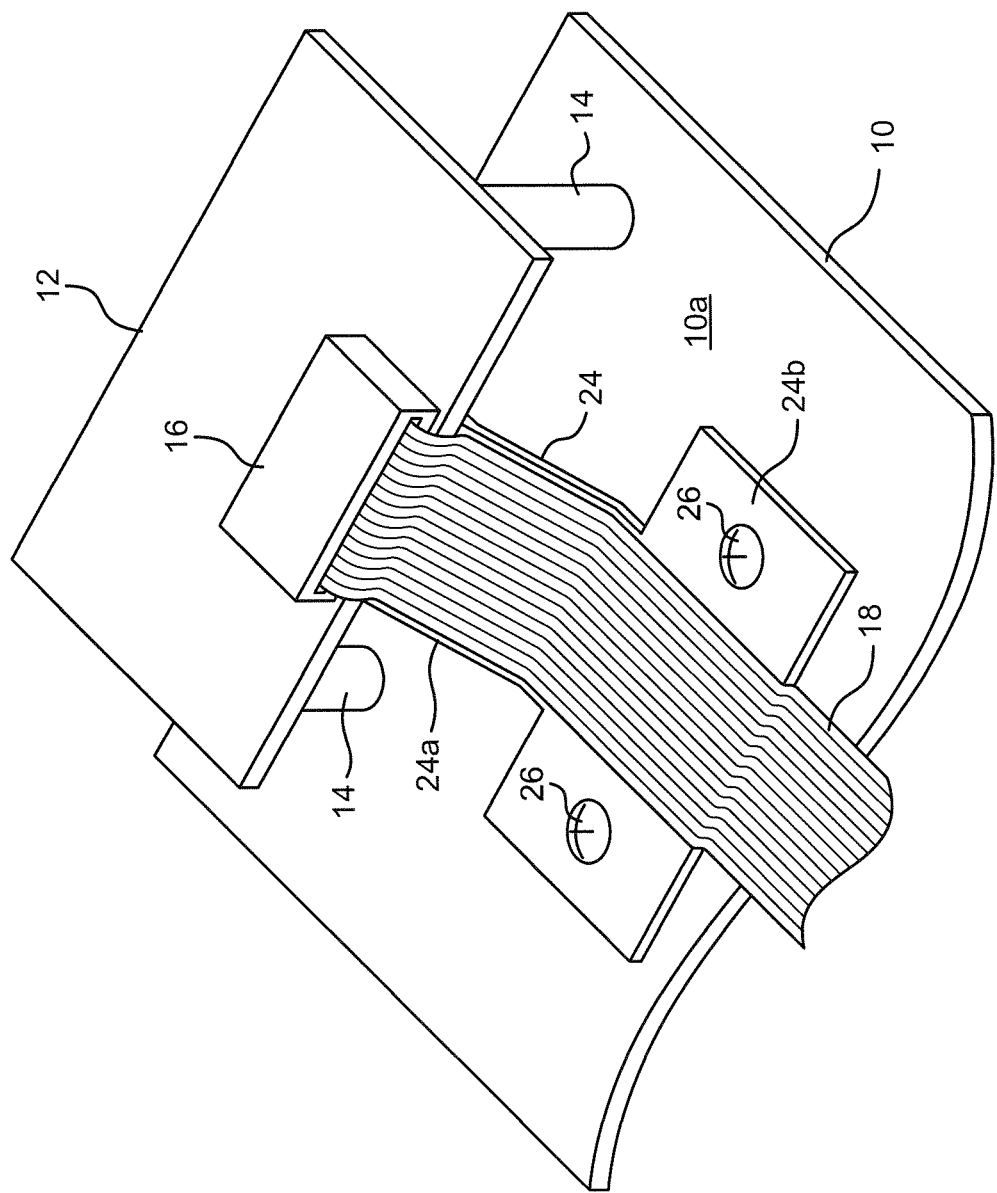
FIG. 7 is a schematic perspective view showing a portion of a flexible flat cable placed between a circuit board and a chassis in the electronic device according to Embodiment 3.

FIG. 6 is a sectional view schematically showing an electronic device according to this Embodiment 3. FIG. 7 is a schematic perspective view showing a portion of the flexible flat cable 18 placed between the circuit board 12 and the chassis 10.

As shown in FIGS. 6 and 7, a cable holding member 24 includes a holding surface 24a for holding a portion of the flexible flat cable 18 ranging from the connector 16 of the circuit board 12 to the surface 10a of the chassis 10, and a base portion 24b to be electrically connected and fixed to the chassis 10. The base portion 24b of the cable holding member 24 is electrically connected and fixed to the chassis 10 with metal screws 26. The flexible flat cable 18 is fixed to the holding surface 24a and the base portion 24b of the cable holding member 24 via an adhesive member 22.

According to Embodiment 3 of the constitution as shown above, most of the flexible flat cable 18 extending from the connector 16 is held by the surface 10a of the chassis 10 and the cable holding member 24. As a result, the characteristic impedance of the flexible flat cable 18 is matched more than cases in which the cable holding member 24 is absent. Thus, radiation of electromagnetic noise from the flexible flat cable 18 is suppressed.

Also, since the cable holding member 24 is fixed to the chassis 10 with the metal screws 26, the cable holding member 24 is fixed to the chassis 10 more strongly than cases in which the cable holding member 24 is fixed by using electroconductive adhesive or electroconductive double-sided tape as in Embodiment 1. Therefore, variations in electrical resistance between the cable holding member 24 and the chassis 10 are lessened. Thus, variations in characteristic impedance of the flexible flat cable 18 are lessened.

Embodiment 4

This Embodiment 4 is an improved embodiment of Embodiment 2 and differs from Embodiment 2 in that the cable holding part is electrically connected to the ground of the circuit board. Therefore, this Embodiment 4 will be described mainly about the difference point from Embodiment 2.

Figure 8:
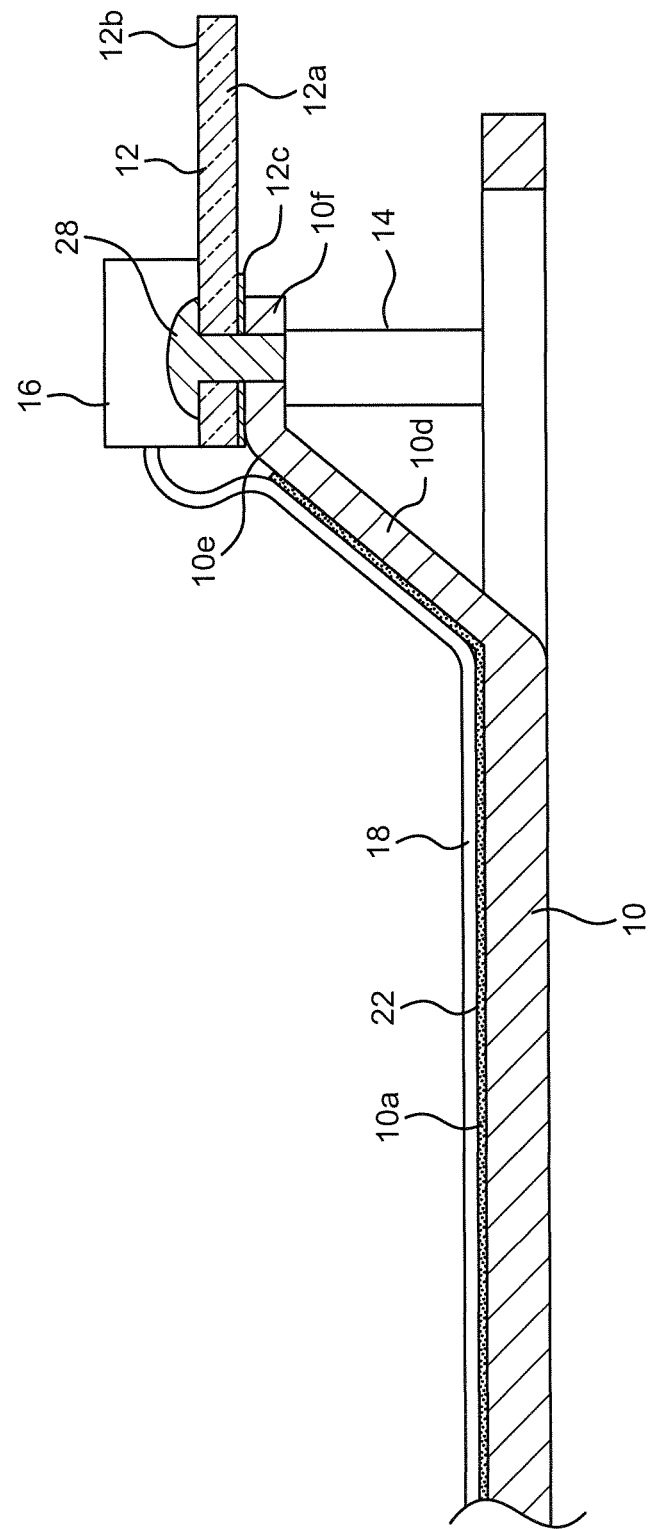
FIG. 8 is a schematic partial sectional view of an electronic device according to Embodiment 4.
Figure 9:
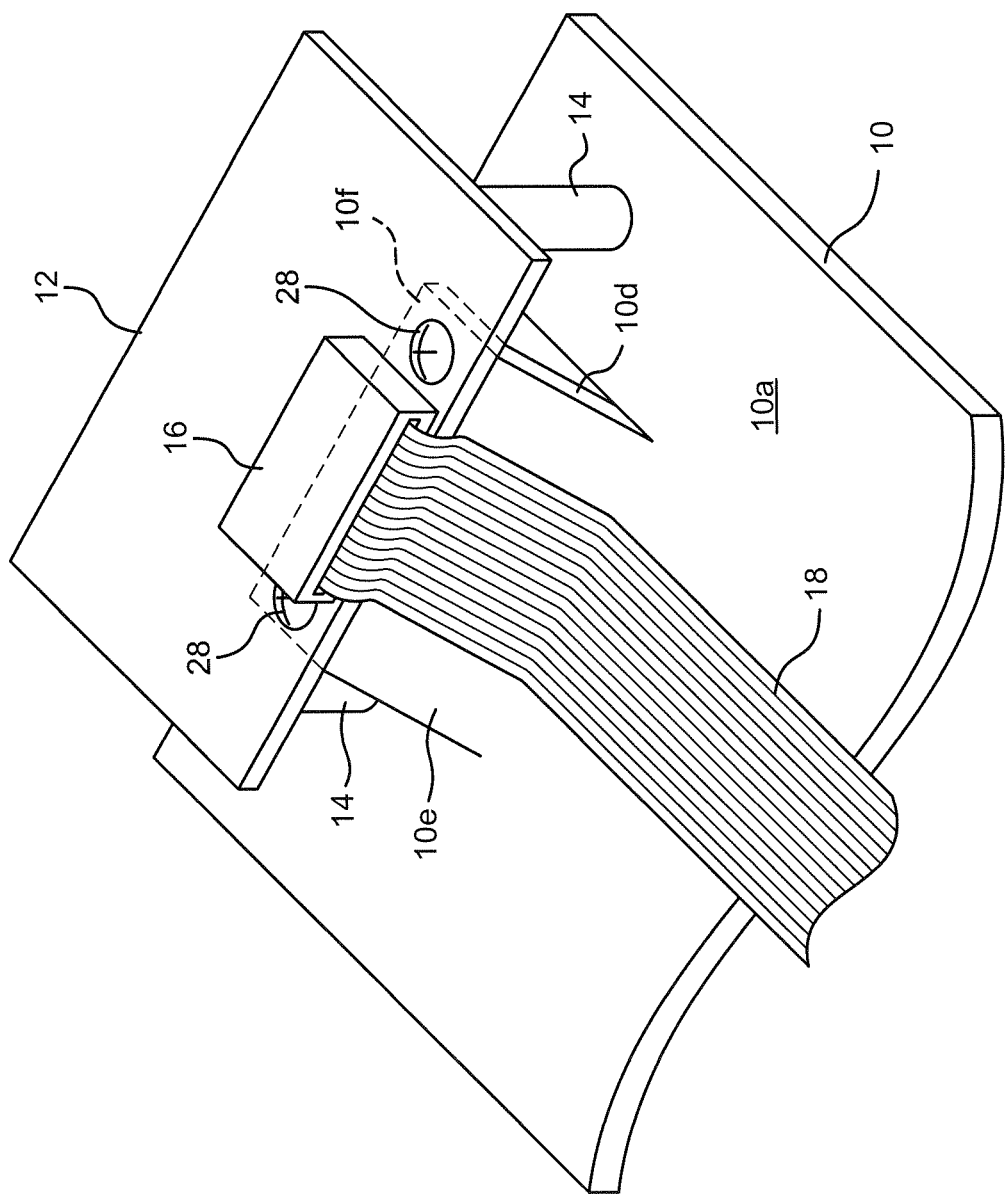
FIG. 9 is a schematic perspective view showing a portion of a flexible flat cable placed between a circuit board and a chassis in the electronic device according to Embodiment 4.

FIG. 8 is a sectional view schematically showing an electronic device according to Embodiment 4. FIG. 9 is a schematic perspective view showing a portion of the flexible flat cable 18 placed between the circuit board 12 and the chassis 10.

As shown in FIG. 8, the circuit board 12 has a ground electrode (pattern) 12c of ground potential at a portion of the surface 12a placed on the rear side of the connector 16. A cable holding part 10d formed in the chassis 10 is formed by process similar to that for the cable holding part 10b of Embodiment 2, i.e., by forming a bracket (square bracket)-shaped cut-in in the chassis 10 and then raising up the portion surrounded by the cut-in.

The cable holding part 10d also includes a holding surface 10e for holding the portion of the flexible flat cable 18 ranging from the connector 16 to the surface 10a of the chassis 10, and a contact portion 10f formed by bending a tip portion so as to be put into contact with the ground electrode 12c.

The contact portion 10f of the cable holding part 10d is electrically connected to the ground electrode 12c of the circuit board 12 with metal screws 28.

According to Embodiment 4 of the constitution as shown above, most of the flexible flat cable 18 extending from the connector 16 is held by the surface 10a of the chassis 10 and its cable holding part 10d. As a result, the characteristic impedance of the flexible flat cable 18 is matched more than cases in which the cable holding part 10d is absent. Thus, radiation of electromagnetic noise from the flexible flat cable 18 is suppressed.

Also, since the ground electrode 12c of the circuit board 12 and the contact portion 10f of the cable holding part 10d of the chassis 10 are electrically connected to each other, a return current that occurs in transmission of signals from the circuit board 12 to the flexible flat cable 18 or vice versa is allowed to flow between the circuit board 12 and the chassis 10 without discontinuity. Thus, radiation of electromagnetic noise due to discontinuous flows of the return current is suppressed.

Table 3 shows radiant intensities of electromagnetic noise in one case where the chassis 10 (contact portion 10f of its cable holding part 10d) and the ground electrode 12c of the circuit board 12 were electrically connected to each other (Example 2), and in another case where no such electrical connection was done (Comparative Example 2). These measurement results were obtained during transmission of signals of 220 MHz to the flexible flat cable 18.

TABLE 3

|  | Horizontally polarized wave (dBμV/m) | Vertically polarized wave (dBμV/m) |
|---|---|---|
| Example 2 | 33 | 37 |
| Comparative Example 2 | 35 | 40 |

As shown in Table 3, radiant intensity of electromagnetic noise was lower by 2 (dBμV/m) for horizontally polarized waves and by 3 (dBμV/m) for vertically polarized waves in Example 2, i.e. when the chassis 10 and the ground electrode 12c of the circuit board 12 were electrically connected to each other, as compared with Comparative Example 2. From these measurement results, it can be understood that electrically connecting the chassis 10 and the ground electrode 12c of the circuit board 12 to each other allows a reduction of electromagnetic noise to be achieved.

Figure 10:
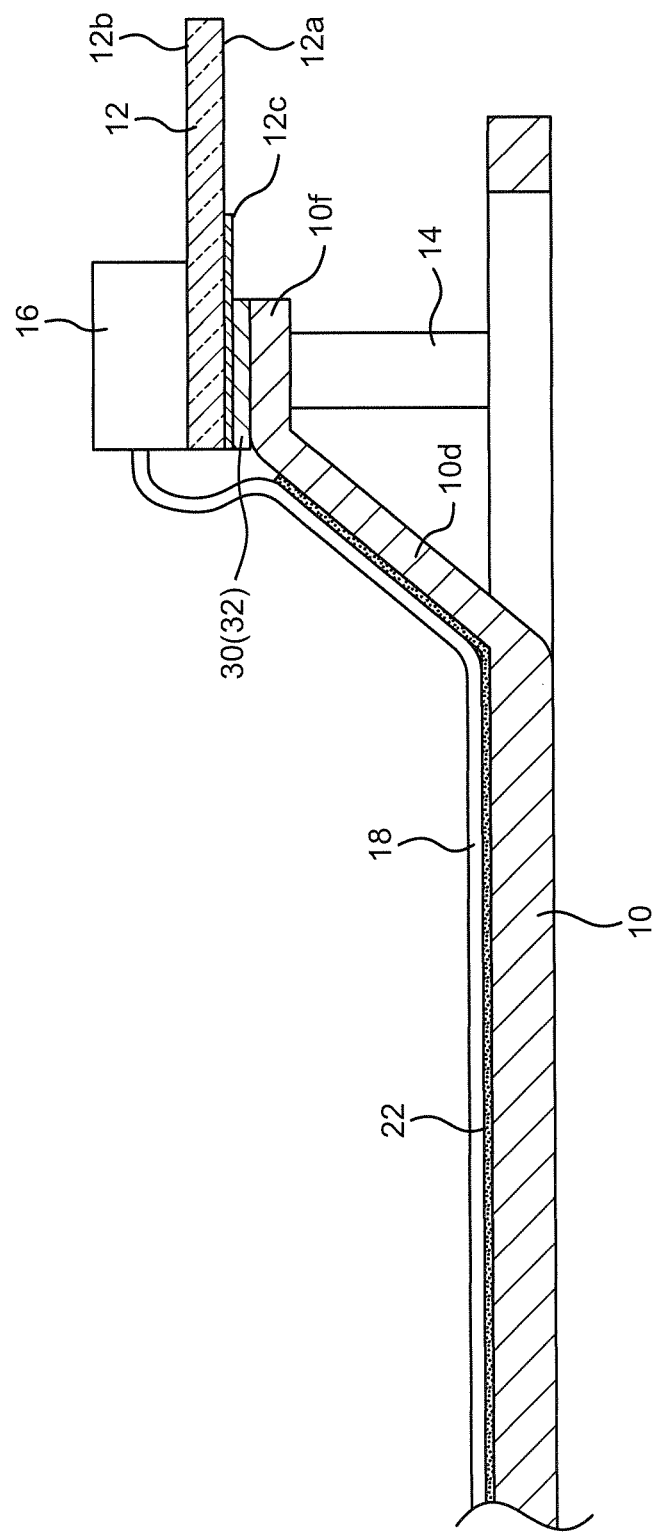
FIG. 10 is a schematic partial sectional view of an electronic device according to an improved embodiment of Embodiment 4.

In addition, the electrical connection between the contact portion 10f of the cable holding part 10d of the chassis 10 and the ground electrode 12c of the circuit board 12 is not limited to that with the metal screws 28. For example, as shown in FIG. 10, the contact portion 10f of the cable holding part 10d and the ground electrode 12c of the circuit board 12 may also be electrically connected to each other by interveniently providing an electroconductive adhesive material 30 or a gasket 32 (electroconductive elastic body in which urethane or other foaming material is covered with a metal mesh) between the contact portion 10f and the ground electrode 12c.

Further, as in Embodiment 4, the cable holding member 20, 24 (cable holding part 10b) electrically connected to the chassis 10 in Embodiments 1 to 3 may also be electrically connected to the ground electrode of the circuit board 12.

Embodiment 5

This Embodiment 5 is an improved embodiment of Embodiments 1 to 4.

As shown in Embodiments 1 to 4, for example as shown in FIGS. 1, 4, 6 and 8, most of the flexible flat cable 18 is held by the chassis 10 and the cable holding member 20, 24 (cable holding part 10b, 10d). However, the portion of the flexible flat cable 18 ranging from the connector 16 to the cable holding member 20, 24 (cable holding part 10b, 10d) is in floating in the air.

This portion in the in-air floating state is a portion necessary for connection of the flexible flat cable 18 to the connector 16 (without this portion, it would be difficult to connect the flexible flat cable 18 to the connector 16). Referring to FIG. 4 as an example, the flexible flat cable 18 is first fixed to the surface 10a of the chassis 10 by the adhesive member 22, and subsequently the tip end is connected to the connector 16. Then, the portion of the flexible flat cable 18 ranging from the connector 16 to the surface 10a of the chassis 10 is fixed to the holding surface 10c of the cable holding part 10b by the adhesive member 22.

With an excessively short length from the portion of the flexible flat cable 18 fixed to the surface 10a of the chassis 10 up to the tip end, it is difficult to connect the tip end of the flexible flat cable 18 to the connector 16. Also, when the flexible flat cable 18 is fixed to the holding surface 10c of the cable holding part 10b after the connection of the tip end to the connector 16, it may occur that the tip end comes out from the connector 16. Therefore, the length from the portion of the flexible flat cable 18 fixed to the surface 10a of the chassis 10 up to the tip end needs to measure a certain length.

By setting the length from the portion of the flexible flat cable 18 fixed to the surface 10a of the chassis 10 up to the tip end in consideration of the connectability to the connector 16 as shown above, it inevitably follows that the portion of the flexible flat cable 18 ranging from the connector 16 to the cable holding part 10b is set to an in-air floating state. Therefore, in this embodiment, the portion in the in-air floating state is minimized as much as possible without sacrificing the connectability of the flexible flat cable 18 to the connector 16, so that radiation of electromagnetic noise from the flexible flat cable 18 is suppressed.

Figure 11:
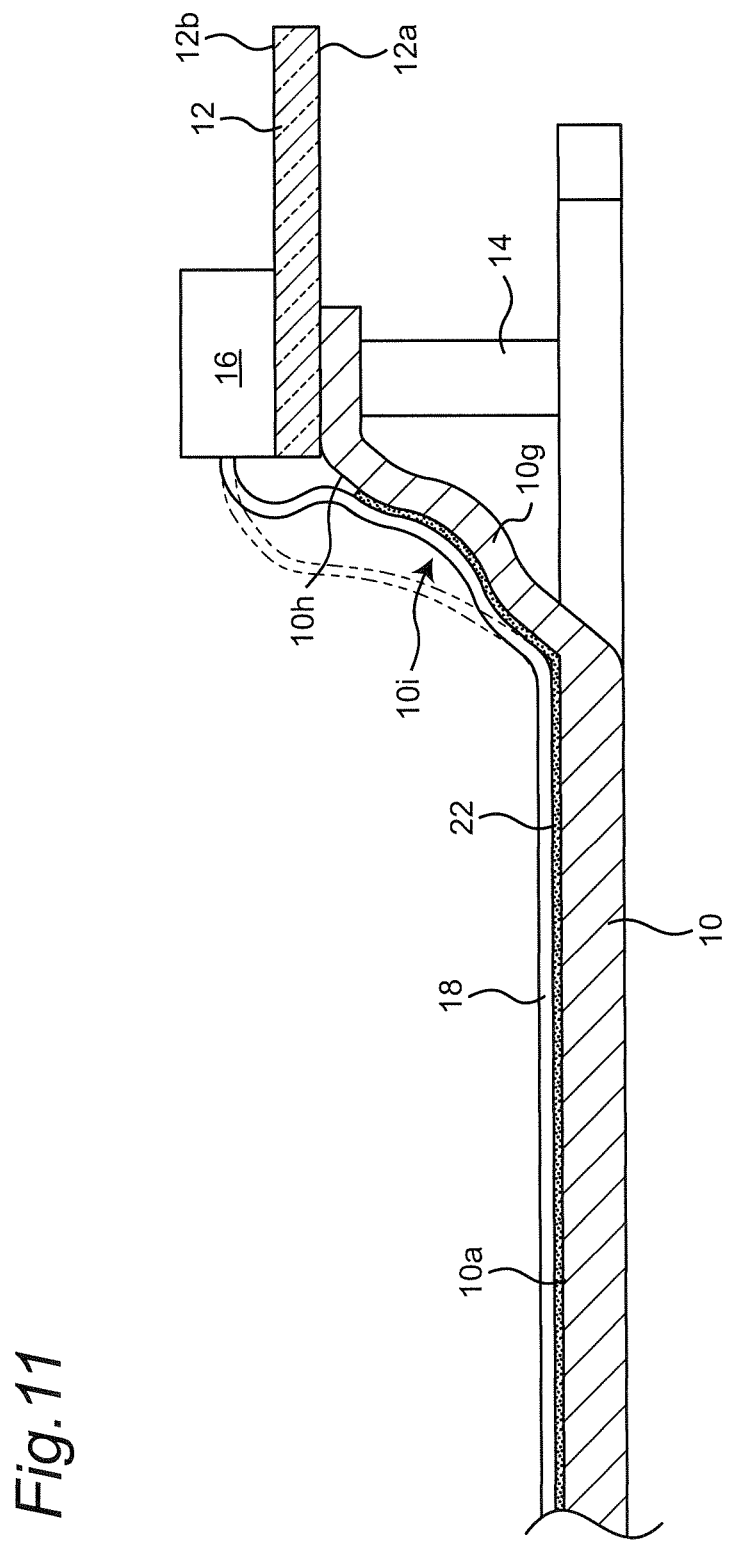
FIG. 11 is a schematic partial sectional view of an electronic device according to Embodiment 5.

FIG. 11 is a schematic sectional view of an electronic device according to Embodiment 5. It is noted that FIG. 11 shows an improved embodiment of Embodiment 2 as this Embodiment 5.

As shown in FIG. 11, a cable holding part 10g of the chassis 10 has, in its holding surface 10h, a curved portion 10i which is curved in a concave shape along an extending direction of the flexible flat cable 18. As a result of this, surface area of the holding surface 10h is increased as compared with cases in which the holding surface 10h is formed by a flat surface.

According to Embodiment 5 of the constitution as shown above, since the portion of the flexible flat cable 18 ranging from the connector 16 to the surface 10a of the chassis 10 as shown by two-dot chain line in FIG. 11 is fixed to the holding surface 10h including the curved portion 10i, the portion in the in-air floating state is decreased as compared with cases in which the portion is fixed to the holding surface formed by a flat surface. Therefore, the portion in the in-air floating state can be minimized as much as possible without sacrificing the connectability of the flexible flat cable 18 to the connector 16, and moreover the radiation of electromagnetic noise from the flexible flat cable 18 can be suppressed.

In addition, the curved portion 10i provided in the holding surface 10h of the cable holding part 10g may be provided in various forms. For example, the holding surface 10h of the cable holding part 10g may be formed in a stepwise shape, in which a plurality of curved portions 10i may be provided. That is, the curved portion 10i may be formed in any shape only if a distance ranging on the holding surface in the extending direction of the flexible flat cable 18 is lengthened as compared with cases in which the holding surface is formed by a flat surface.

Embodiment 6

This Embodiment 6 is an improved embodiment of Embodiments 1 to 5 and intended to improve the connectability of the flexible flat cable 18 to the connector 16 of the circuit board 12.

Figure 12:
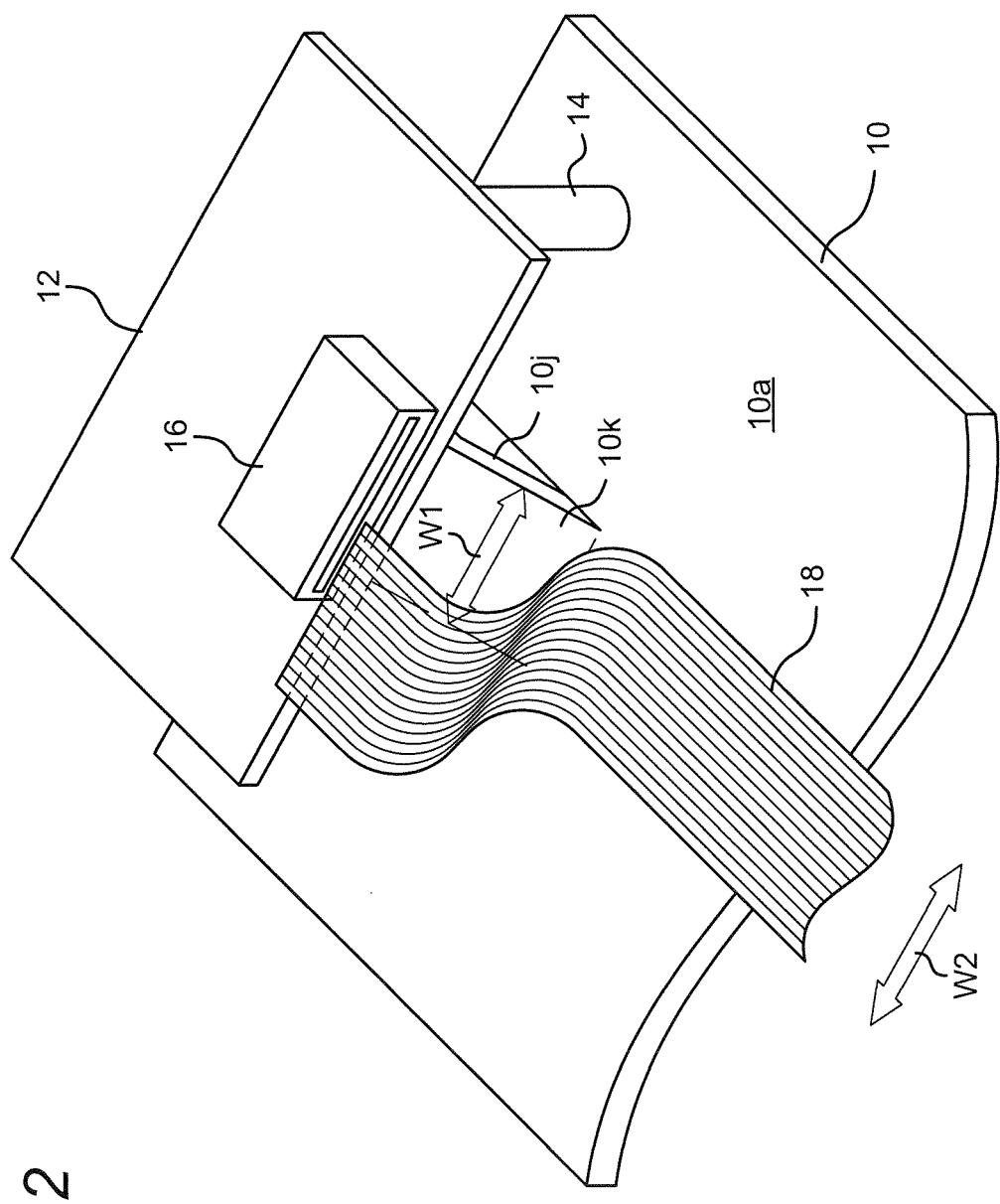
FIG. 12 is a schematic perspective view showing a state before connection between a circuit board and a flexible flat cable in an electronic device according to Embodiment 6.

FIG. 12 shows a state before connection between the connector 16 of the circuit board 12 and the flexible flat cable 18 in an electronic device according to Embodiment 6. It is noted that FIG. 12 shows an improved embodiment of Embodiment 2 as this Embodiment 6.

As shown in FIG. 12, a width W1 of a holding surface 10k of a cable holding part 10j of the chassis 10 is set smaller than a width W2 of the flexible flat cable 18.

According to Embodiment 6 of the constitution as shown above, it can be avoided that the cable holding part 10j is put into contact with fingers when widthwise both ends of near tip end of the flexible flat cable 18 are pinched, for example, by thumb and forefinger or by both-hand fingers to execute the connection of the tip end to the connector 16. Also, after the connection of the tip end to the connector 16, widthwise both ends of the flexible flat cable 18, while being grasped by fingers, can be fixed correctly to the holding portion 10k of the cable holding part 10j. As a result of this, variations in fitting accuracy of the flexible flat cable 18 to the cable holding part 10j can be suppressed to small ones. That is, variations in the characteristic impedance of the portion of the flexible flat cable 18 fixed to the cable holding part 10j are suppressed to small ones. As a result of this, radiation of electromagnetic noise from the flexible flat cable 18 can be suppressed stably without variations.

Embodiment 7

This Embodiment 7 is an improved embodiment of Embodiments 1 to 6.

Figure 13:
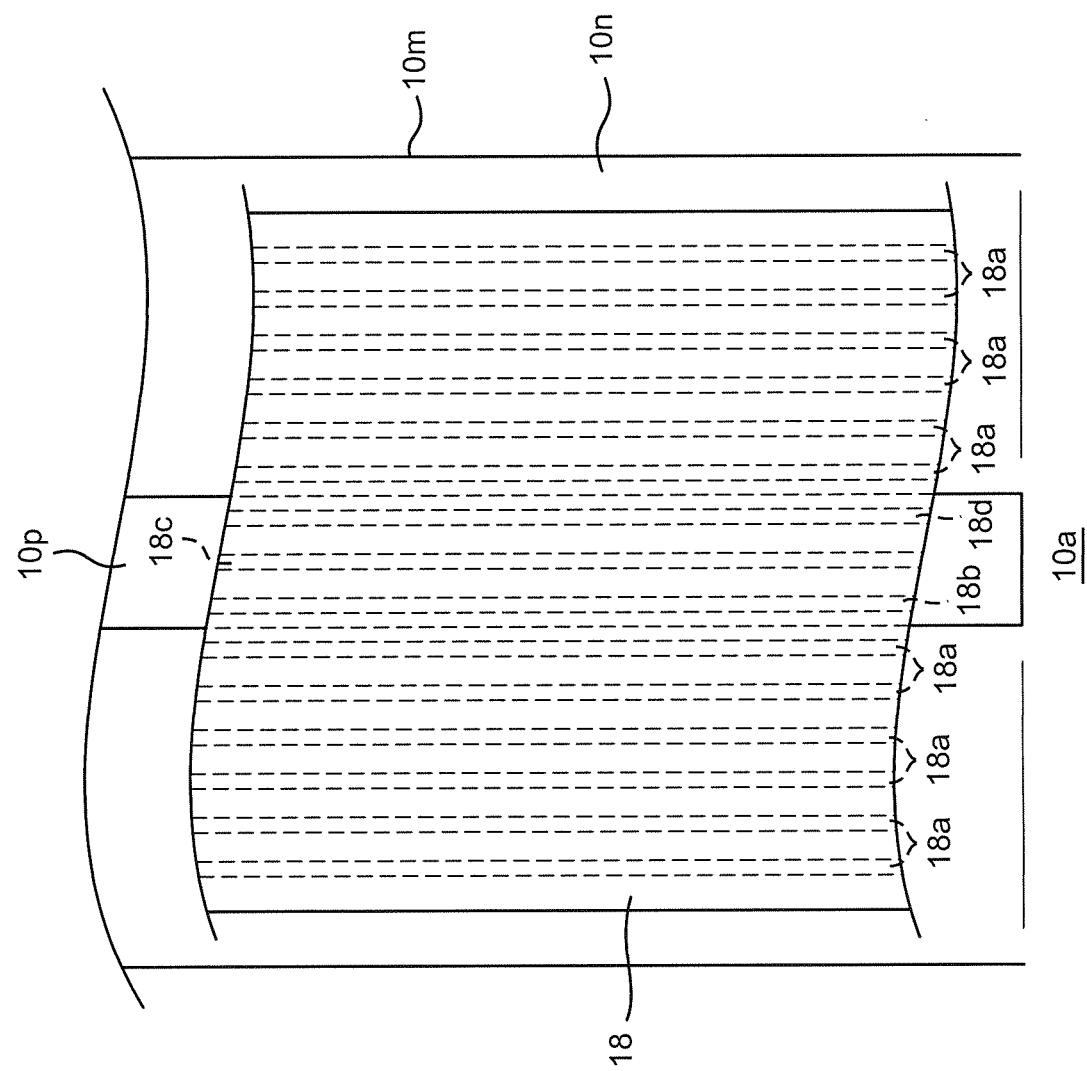
FIG. 13 is a front view of a cable holding part in an electronic device according to Embodiment 7.

FIG. 13 is a front view of a cable holding part 10m of the chassis 10. The flat cable 18 has a plurality of paired signal lines 18a for transmission of differential signals, and a plurality of signal lines 18b, 18c, 18d for transmission of other signals.

As shown in FIG. 13, the cable holding part 10m of the chassis 10 is so made up that its holding surface 10n holds portions of the flexible flat cable 18 where the plurality of paired signal lines 18a for transmission of differential signals are disposed. That is, slits 10p are formed at portions of the holding surface 10n facing portions of the flexible flat cable 18 where the other signal lines 18b, 18c, 18d are disposed. The reason of this arrangement is that most of electromagnetic noise generated from the flexible flat cable 18 is derived from the paired signal lines 18a for transmission of differential signals. Therefore, attaining a matching of the characteristic impedance of the portions of the flexible flat cable 18 where the paired signal lines 18a are disposed makes it possible to sufficiently suppress the electromagnetic noise radiated from the flexible flat cable 18.

According to Embodiment 7 of the constitution as shown above, the quantity of material to be used for the cable holding part 10m of the chassis 10 can be reduced. In particular, providing slits in the cable holding member independent of the chassis 10 as in the case of the cable holding member 24 of Embodiment 3 as an example makes it possible to cut down the manufacturing cost (material cost) of the cable holding member.

In a case where signal lines placed on both sides of the flexible flat cable 18, respectively, are other than the paired signal lines for transmission of differential signals, width of the holding surface 10n of the cable holding part 10m may be lessened instead of providing the slits 10p. In this case also, effects similar to those of Embodiment 6 can be obtained.

As shown hereinabove, Embodiments 1 to 7 have been described as examples of arts disclosed in the present application. However, the arts of this disclosure are not limited to those ones and may be applied to other embodiments in which changes, substitutions, additions, omissions and others are made thereon as required. Furthermore, individual components and members of the disclosure described in the above Embodiments 1 to 7 may be combined in various ways thereamong so as to make up additional embodiments.

Figure 14:
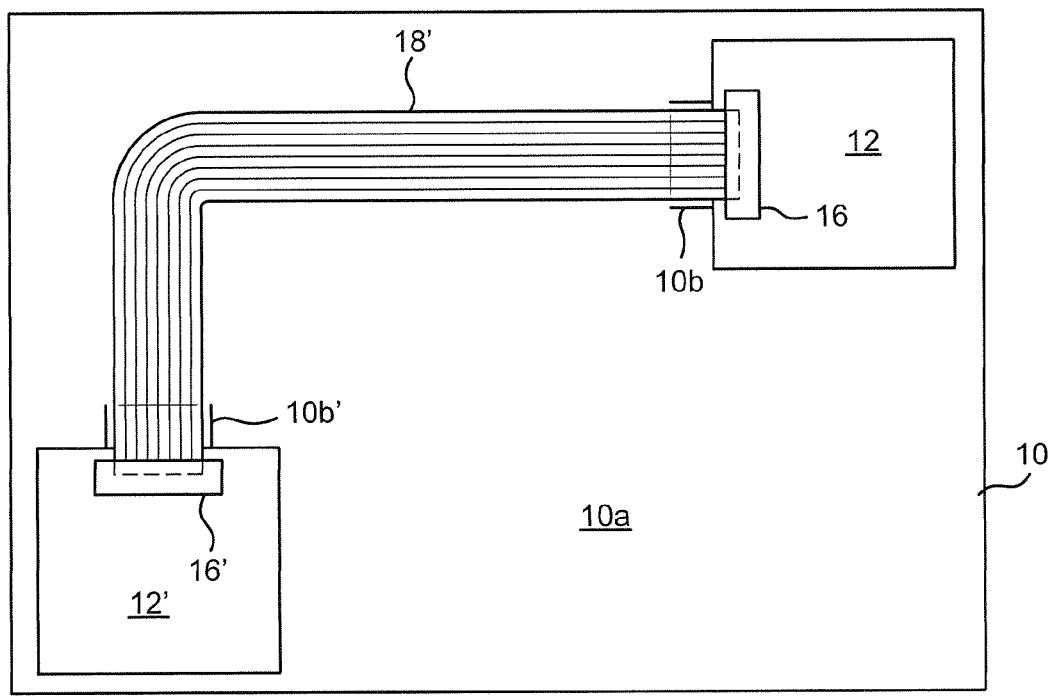
FIG. 14 is a view showing another embodiment of the flexible flat cable.

For example, the flexible flat cable 18 shown in FIG. 1 is linear-shaped but not limited to this. As an example, as shown in FIG. 14, the flexible flat cable 18 may be an L-shaped flexible flat cable 18'. Even with the flexible flat cable 18 having such a shape, holding its portion between the connector 16 of the circuit board 12 and the connector 16' of the circuit board 12' by the chassis 10 and its cable holding parts 10b, 10b' (or cable holding member) makes it possible to suppress the radiation of electromagnetic noise, as in the case of the linear-shaped flexible flat cable 18 in Embodiments 1 to 7.

Figure 15:
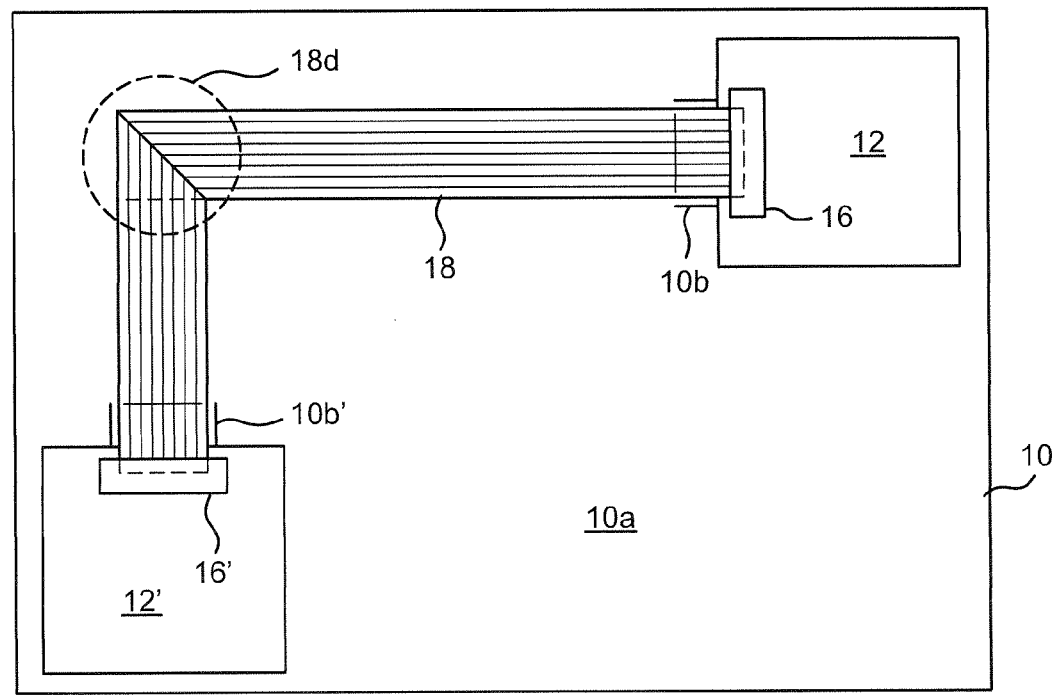
FIG. 15 is a view showing another embodiment of the flexible flat cable.

Further, as shown in FIG. 15 as an example, even in a state that the linear-shaped flexible flat cable 18 is bent (i.e., in a state that a bent portion 18d is included), holding its portion between the connector 16 of the circuit board 12 and the connector 16' of the circuit board 12' (including the bent portion 18d) by the chassis 10 and its cable holding parts 10b, 10b' makes it possible to reduce the radiation of electromagnetic noise, as in the case of the linear-shaped flexible flat cable 18 in Embodiments 1 to 7.

Further, the flexible flat cable may serve for transmission of signals between the circuit board and other electronic devices fixed to the chassis such as hard disks.

Further, the circuit board may be fixed directly onto the surface of the chassis without intervention of spacers. For example, the circuit board may be fixed onto a protrusive boss portion formed on the surface of the chassis.

Furthermore, although the foregoing plural embodiments have been described by taking an example of flexible flat cables as the flexible cable, yet this disclosure is not limited to flexible flat cables, and flexible printed circuits may also be applied thereto. That is, this disclosure may be applied to any cable that is deformable.

Furthermore, although the flexible cable (flexible flat cable) is held on the surface of the chassis of the electronic device in the foregoing plural embodiments, yet this disclosure is not limited to this. The flexible cable has only to be held to the surface of a conductor plate made from an electroconductive material.

This disclosure is applicable to not only televisions but also, for example, electronic devices having a flexible cable for transmission of differential signals.

What is claimed is:

1. An electronic device comprising:
   a conductor plate;
   a circuit board placed with a distance to a surface of the conductor plate;
   a connector provided on the circuit board;
   a flexible cable having one end connected to the connector and laid down along the surface of the conductor plate; and
   a cable holding member which includes a sloped holding surface for holding at least part of a portion of the flexible cable ranging from the connector to the surface of the conductor plate and which is electrically connected to the conductor plate;

wherein the cable holding member is part of the conductor plate.

2. The electronic device according to claim 1, wherein the holding surface of the cable holding member extends from an edge of the circuit board to the surface of the conductor plate.

3. The electronic device according to claim 1, wherein the cable holding member is electrically connected to a ground provided on the circuit board.

4. The electric device according to claim 1, wherein the cable holding member is not contacted to a ground provided on the circuit board.

5. The electronic device according to claim 1, further comprising a bonding member for bonding the flexible cable to the holding surface of the cable holding member and the surface of the conductor plate.

6. The electronic device according to claim 5, wherein the bonding member is insulative.

7. The electronic device according to claim 5, wherein the bonding member is electroconductive.

8. The electronic device according to claim 1, wherein the holding surface of the cable holding member has a width smaller than that of the flexible cable.

9. The electronic device according to claim 1, wherein the holding surface of the cable holding member has a portion which is curved in a concave shape along an extending direction of the flexible cable.

10. The electronic device according to claim 1, wherein the flexible cable is a flexible printed circuit.

11. The electronic device according to claim 1, wherein the flexible cable is a flexible flat cable.

12. The electronic device according to claim 11, wherein the flexible flat cable includes paired signal lines for transmission of differential signals and at least one signal line other than the paired signal lines, and the holding surface of the cable holding member which holds a portion of the flexible flat cable where the paired signal lines are laid down and which has a slit at a portion of the holding surface facing a portion of the flexible flat cable where the signal line other than the paired signal lines is laid down.

13. The electronic device according to claim 11, wherein the flexible flat cable includes a bent portion, and the bent portion is held by the surface of the conductor plate.

14. The electronic device according to claim 1, wherein the conductor plate is a conductor chassis.

15. The electronic device according to claim 1, further comprising:

a second circuit board placed with a distance to the surface of the conductor plate;

a second connector which is provided on the second circuit board and to which the other end of the flexible cable is connected; and a second cable holding member which includes a sloped holding surface for holding at least part of a portion of the flexible cable ranging from the second connector to the surface of the conductor plate and which is electrically connected to the conductor plate.

* * * * *